(12) United States Patent
Wang et al.

(10) Patent No.: US 7,893,768 B2
(45) Date of Patent: Feb. 22, 2011

(54) AUTOMATIC GAIN CONTROL

(75) Inventors: Zhengyu Wang, Plano, TX (US); Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 12/400,898

(22) Filed: Mar. 10, 2009

(65) Prior Publication Data

US 2010/0231299 A1   Sep. 16, 2010

(51) Int. Cl.
   *H03G 3/10*   (2006.01)
(52) U.S. Cl. .................................................. 330/279
(58) Field of Classification Search ......... 330/253–254, 330/282, 279
   See application file for complete search history.

(56) References Cited

U.S. PATENT DOCUMENTS 4,066,977 A   1/1978   Chambers et al.
4,637,066 A   1/1987   Kennedy et al.
5,793,241 A   8/1998   Sanzo et al.
6,388,524 B1   5/2002   Anderson et al.
6,420,934 B1 *   7/2002   Butler et al. ................ 330/279

FOREIGN PATENT DOCUMENTS

WO   WO 01/61842   8/2001
WO   WO 2008/070349   6/2008

* cited by examiner

*Primary Examiner*—Robert Pascal
*Assistant Examiner*—Khiem D Nguyen
(74) *Attorney, Agent, or Firm*—John J. Patti; Wade J. Brady, III; Frederick J. Telecky, Jr.

(57) ABSTRACT

A method and system for providing automatic gain control for a differential amplifier are provided. An impedance network is set to have a first impedance that corresponds to a first gain for a differential amplifier, which amplifies an input signal by the first gain. Once the amplified input signal is greater than a first threshold voltage, the impedance network is set to have a second impedance that corresponds to a second gain for the differential amplifier, which amplifies the input signal. Once amplified input signal is greater than a second threshold voltage and a predetermined period has lapsed, the impedance network is reset to have the first impedance that corresponds to a first gain for the differential amplifier.

20 Claims, 5 Drawing Sheets

AUTOMATIC GAIN CONTROL

TECHNICAL FIELD

The invention relates generally to an amplifier and, more particularly, to an automatic gain control for a differential amplifier.

BACKGROUND

Figure 1:
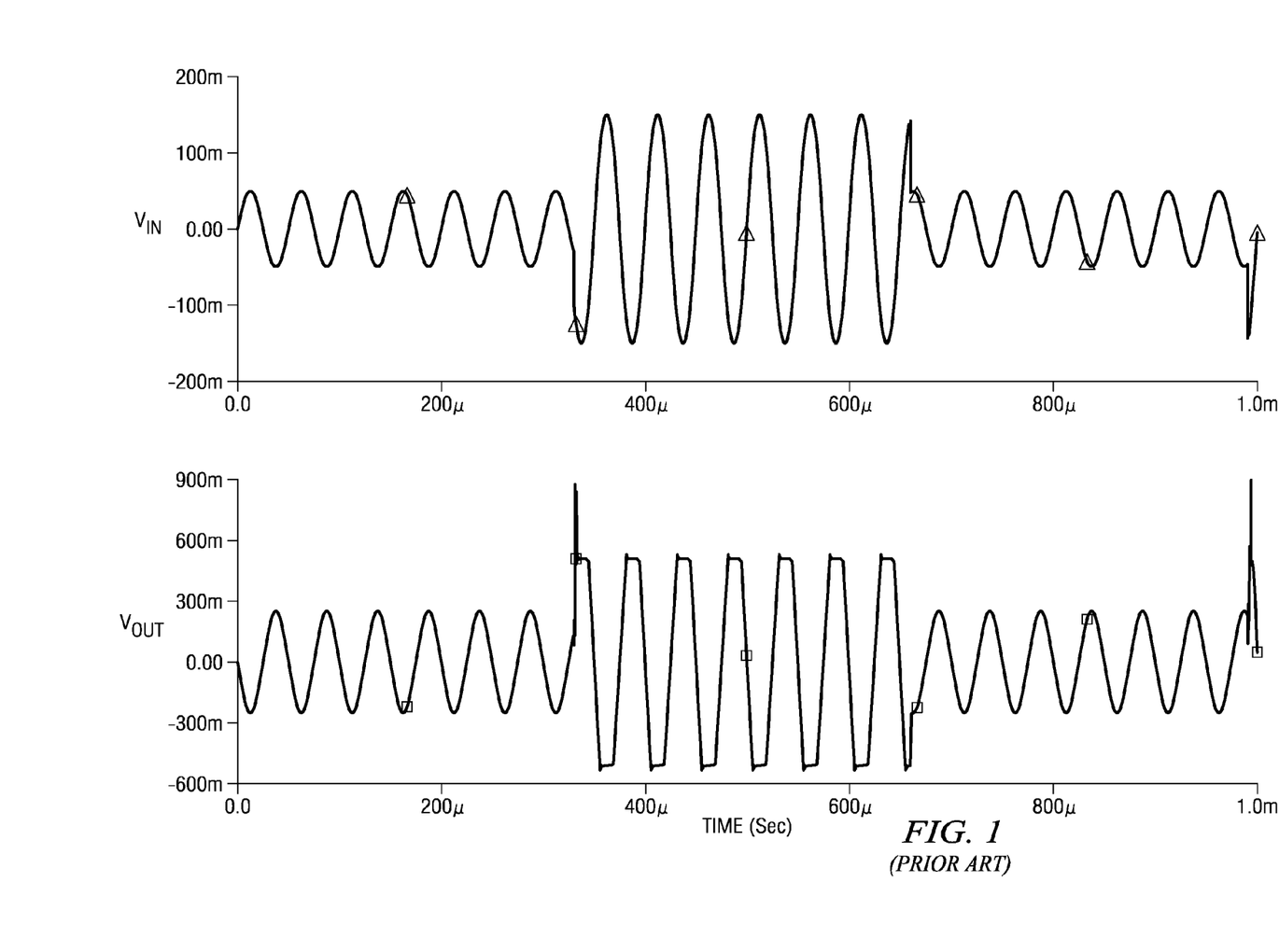
FIG. 1 is a graph depicting the input and output voltages for an amplifier employing a convention AGC.

Referring to FIG. 1 of the drawings, a graph depicting the input and output voltage signals for an amplifier having conventional automatic gain control (AGC) is shown. As can be seen, for input voltages that are low, the amplifier outputs a signal having a low total harmonic distortion (THD), while there is larger THD for the larger input voltages. This is, at least in part, due to a tradeoff between the maximum, set peak-to-peak voltage and the THD, where there is a relationship between the maximum or largest size of the signal swing and the THD. This relationship means that for very large maximum, set peak-to-peak voltage the THD is also very large. So it is difficult to implement an AGC for an amplifier that has both a large maximum, set peak-to-peak voltage and a small THD. Some examples of convention amplifier arrangements are U.S. Pat. No. 4,066,977; U.S. Pat. No. 4,637,066; U.S. Pat. No. 5,793,241; U.S. Pat. No. 6,388,524; PCT Publication No. WO2001/061842; and PCT Publication No. WO2008/070349.

SUMMARY

A preferred embodiment of the present invention, accordingly, provides an apparatus. The apparatus comprises an amplifier having a first gain and a second gain that are selected by a first selection signal, wherein the amplifier receives the an input voltage and generates a plurality of output voltages by amplifying the input voltage by one of the first and second gains; a comparator that receives the plurality of output voltages from the amplifier, wherein the comparator compares the greater of the plurality of outputs from the amplifier to one of a first threshold voltage and a second threshold voltage; a switch network that is adapted to provide at least one of the first and second threshold voltages to the comparator based on a second selection signal; and gain adjustment logic that receives an output from the comparator, that provides the first selection signal to the amplifier, and that provides the second selection signal to the switch network, wherein the gain adjustment logic provides a hysteresis when transitioning from the second gain to the first gain.

In accordance with a preferred embodiment of the present invention, the gain adjustment logic further comprises a counter that receives the output from the comparator and that outputs the second selection signal; an inverter that receives the second selection signal and generates the first selection signal from the second selection signal; and an OR gate that logically ORs the second selection signal with a first clock signal and that provides a second clock signal to the counter.

In accordance with a preferred embodiment of the present invention, the switch network further comprises an inverter that receives the second selection signal and generates the first selection signal from the second selection signal; a first transistor that receives the first selection signal at its gate and that receives the first threshold voltage at its drain; and a second transistor that receives the second selection signal at its gate, that receives the second threshold voltage at its drain, and that is coupled to the source of the first transistor at its source.

In accordance with a preferred embodiment of the present invention, the amplifier receives a feedback voltage from the comparator.

In accordance with a preferred embodiment of the present invention, the amplifier further comprises a differential amplifier having a first amplifier stage that receives a non-inverting input signal and an inverting input signal; a second amplifier stage that is coupled to the first amplifier stage and, that provides the plurality of output voltages; and a common mode stage that is coupled to the first and second amplifier stages and that receives a common mode reference voltage; and an impedance network that is coupled to the differential amplifier and that is adapted to generate provide a first impedance and a second impedance for the differential amplifier that correspond to the first and second gains for the differential amplifier based on the first selection signal.

In accordance with a preferred embodiment of the present invention, the impedance network further comprises a first resistor that is coupled to the amplifier section of the differential amplifier; a second resistor that is coupled to the first resistor; a third resistor that is couple between the second resistor and the amplifier section of the differential amplifier; a first switch that is coupled in parallel to the third switch, wherein the first switch is actuated and deactuated by the first selection signal; a fourth resistor that is coupled to the amplifier section of the differential amplifier; a fifth resistor that is coupled to the second fourth resistor; a sixth resistor that is coupled between the fifth resistor and the amplifier section of the differential amplifier; and a second switch that is coupled in parallel to the sixth resistor, wherein the second switch is actuated and deactuated by the first selection signal.

In accordance with a preferred embodiment of the present invention, the first amplifier stage further comprises a current mirror; a pair of differential input FETs, wherein each FET is coupled to the current mirror, and wherein each FET receives one of the non-inverting and the inverting input signals; and a bias transistor that is coupled to each of the FETs.

In accordance with a preferred embodiment of the present invention, the comparator further comprises a first FET that is coupled to the switch network at its gate, that is coupled to a first voltage rail at its drain, and that is coupled to a second voltage rail at its source; a second FET that is coupled to the first voltage rail at its drain and that receives at least one of the output voltages at its gate; a third FET that is coupled to the first voltage rail at its drain and that receives at least one of the output voltages at its gate; a fourth FET that is coupled to the first voltage rail at its source; a fifth FET that is coupled to the source of the first FET at its gate and that is coupled to the drain of the fourth FET at its source; a sixth FET that is coupled to the sources of the second and third FETs at its gate and that is coupled to the drain of the fourth FET at its source.

In accordance with a preferred embodiment of the present invention, an apparatus is provided. The apparatus comprises a differential amplifier having a first amplifier stage that receives a non-inverting input signal and an inverting input signal; a second amplifier stage that is coupled to the first amplifier stage and, that provides the plurality of output voltages; and a common mode stage that is coupled to the first and second amplifier stages and that receives a common mode reference voltage; an impedance network that is coupled to the differential amplifier and that is adapted to generate provide a first impedance and a second impedance for the differential amplifier that correspond to a first gain and a second gain for the differential amplifier based on a first selection signal; a comparator that is coupled to the amplifier section of the differential amplifier so as to receives the first and second output signals from the amplifier section and to provide the inverting and non-inverting feedback signals to the amplifier section, wherein the comparator compares the greater of the plurality of outputs from the amplifier to one of a first threshold voltage and a second threshold voltage; a switch network that is coupled to the comparator, wherein the switch network is adapted to provide one of the first and the second threshold voltages to the comparator based on a second selection signal; a counter that receives the output from the comparator and that outputs the second selection signal, wherein the counter provides a hysteresis when transitioning from the second gain to the first gain; and output logic is coupled to the inverter and the impedance network, wherein the output logic receives the second selection signal and generates the first selection signal from the second selection signal, and wherein the output logic provides a second clock signal to the counter.

In accordance with a preferred embodiment of the present invention, the output logic further comprises an inverter that receives the second selection signal and generates the first selection signal from the second selection signal; and an OR gate that logically ORs the second selection signal with a first clock signal and that provides a second clock signal to the counter.

In accordance with a preferred embodiment of the present invention, a method for providing automatic gain control for a differential amplifier is provided. The method comprising the steps of setting an impedance network to have a first impedance that corresponds to a first gain for the differential amplifier; amplifying an input signal by the first gain; determining whether the input signal that is amplified by the first gain is greater than a first threshold voltage; setting the impedance network to have a second impedance that corresponds to a second gain for the differential amplifier if the input signal that is amplified by the first gain is greater than the first threshold voltage; amplifying an input signal by the second gain; determining whether the input signal that is amplified by the second gain is greater than a second threshold voltage; determining whether a predetermined period has lapsed if the input signal that is amplified by the second gain is greater than the second threshold voltage; and resetting the impedance network to have the first impedance that corresponds to a first gain for the differential amplifier.

In accordance with a preferred embodiment of the present invention, the step of determining whether the input signal that is amplified by the first gain is greater than a first threshold voltage further comprises receiving a first output signal and a second output signal from the differential amplifier by a comparator; providing a first feedback signal and a second feedback signal to the differential amplifier; and comparing the greater of the first and second output signals to the first threshold voltage.

In accordance with a preferred embodiment of the present invention, the method further comprises the step of setting a switch network to transmit the second threshold voltage to a comparator if the input signal that is amplified by the first gain is greater than a first threshold voltage.

In accordance with a preferred embodiment of the present invention, the method further comprises the step of setting a switch network to transmit the first threshold voltage to a comparator if the predetermined period has lapsed.

In accordance with a preferred embodiment of the present invention, the method further comprises the steps of clearing a counter if the input signal that is amplified by the first gain is greater than the first threshold voltage; and starting the counter if the input signal that is amplified by the first gain is greater than the first threshold voltage.

In accordance with a preferred embodiment of the present invention, the step of determining whether the predetermined period has lapsed if the input signal that is amplified by the second gain is greater than the second threshold voltage further comprises determining if the counter is full.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 2:
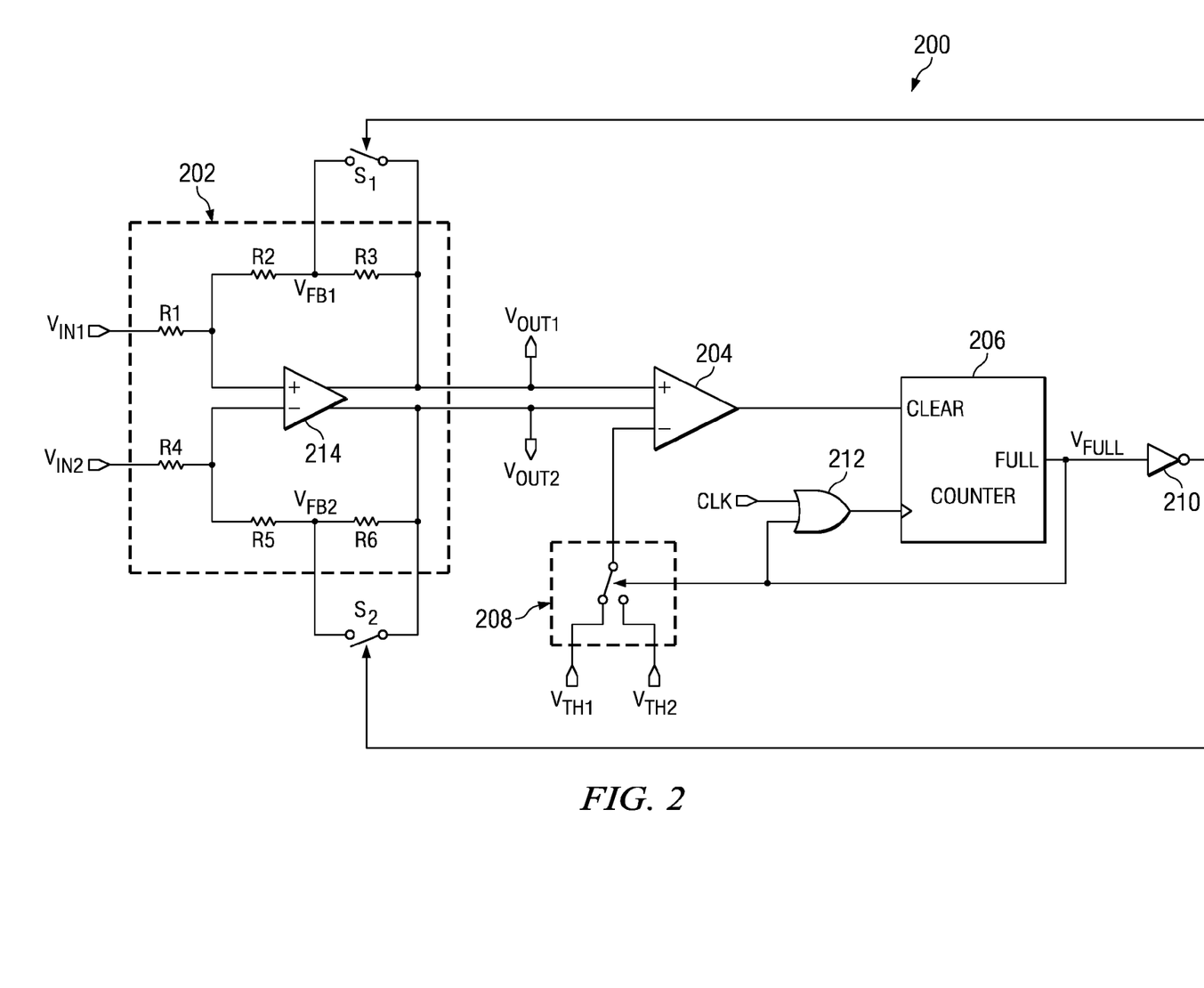
FIG. 2 is a block diagram depicting system having a differential amplifier with a AGC in accordance with a preferred embodiment of the present invention.
Figure 3:
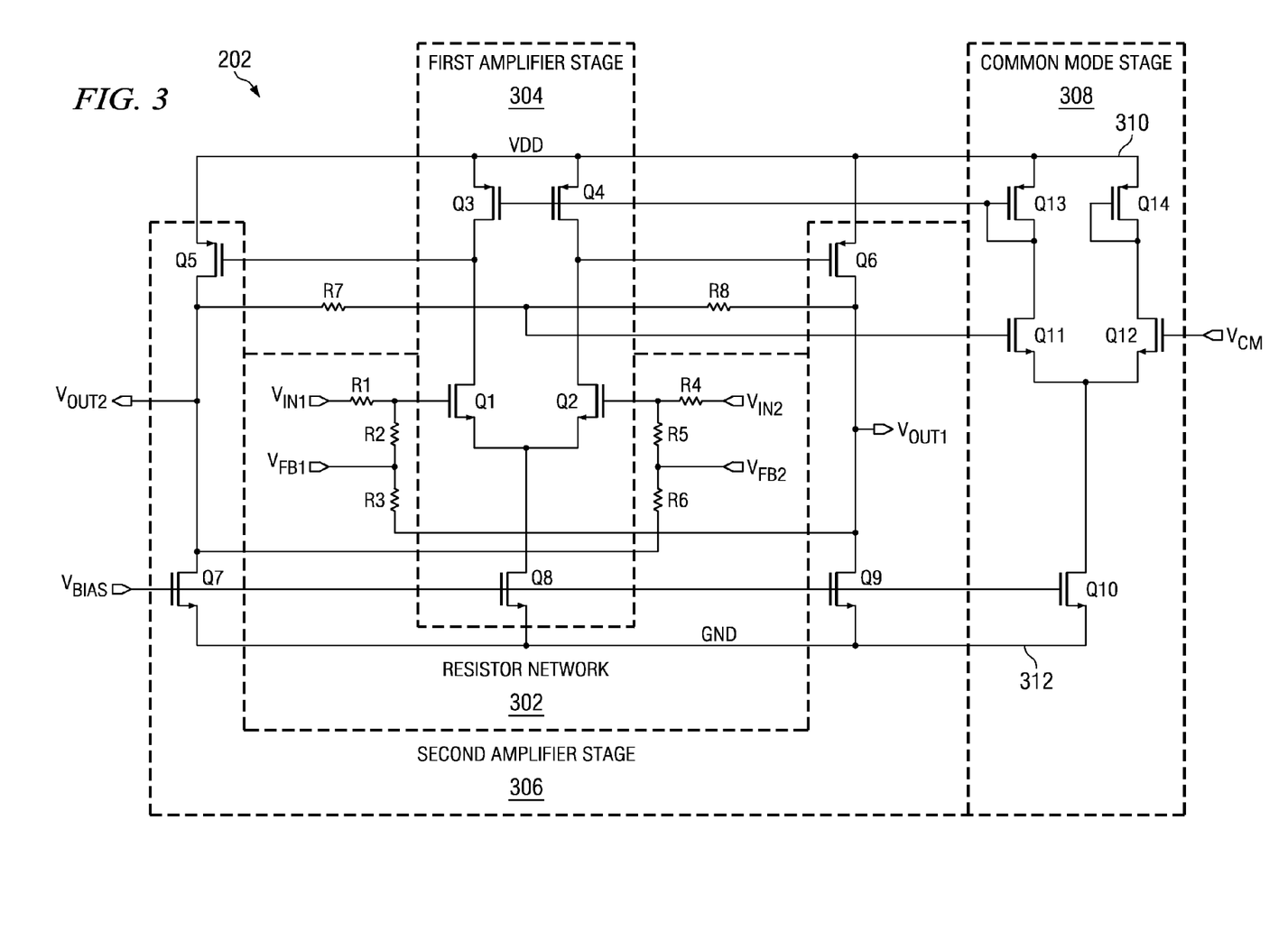
FIG. 3 is a circuit diagram of at least a portion of the differential amplifier of FIG. 2.
Figure 4:
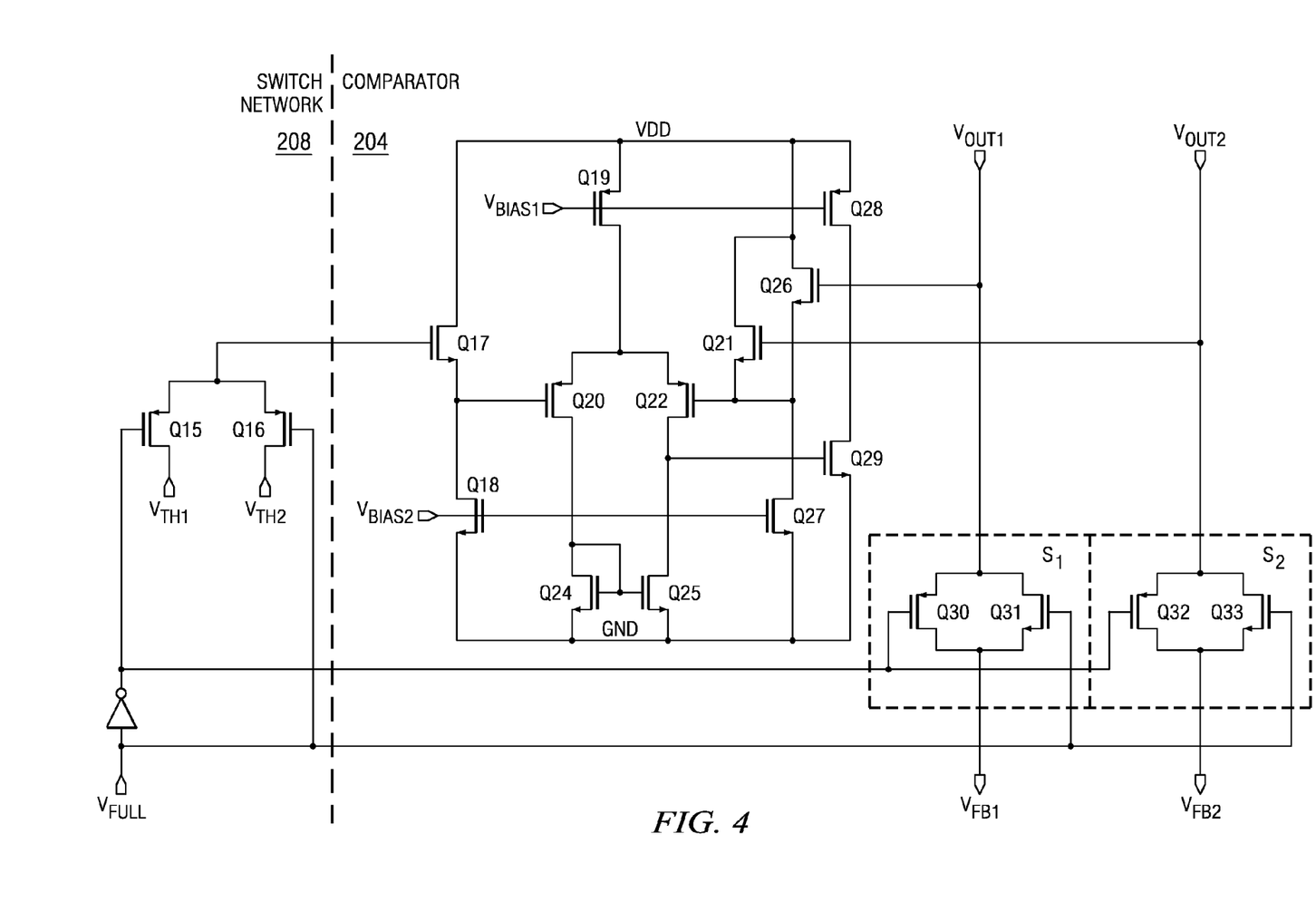
FIG. 4 is a circuit diagram of at least a portion of the comparator and switch network of FIG. 2.

Referring to FIGS. 2-4 of the drawings, a system 200 having a differential amplifier with an AGC is shown. The system 200 generally comprises an amplifier 202, a comparator 204, and gain adjustment logic (preferably counter 206 and output logic). Additionally, the amplifier 202 is generally comprised of an impedance network, and a multi-stage differential amplifier 214.

Looking first to the impedance network, it is generally comprised of resistors $R_1$ through $R_6$ (or resistor network 302) and switches $S_1$ and $S_2$. The impedance network is generally adapted to have two different impedances that correspond to gains for the differential amplifier 214 by forming feedback networks for each of the differential inputs of the differential amplifier 214. Each of resistors $R_1$ and $R_4$ (which preferably have the same value) receive the differential input signals $V_{IN1}$ and $V_{IN2}$ and are coupled to input terminals to the inverting and non-inverting terminals of differential amplifier 214. Also, coupled to the resistors $R_1$ and $R_4$ are resistors $R_2$ and $R_5$ (which preferably have the same value), respectively. Resistors $R_3$ and $R_6$ (which preferably have the same value) are coupled between resistors $R_2$ and $R_5$ and output terminals $V_{OUT1}$ and $V_{OUT2}$. Additionally, switches $S_1$ and $S_2$ are coupled in parallel to resistors $R_3$ and $R_6$, respectively. These switches $S_1$ and $S_2$ are generally transmission gates and are shown as transistors $Q_{30}$ through $Q_{33}$ of FIG. 4.

In operation, the switches $S_1$ and $S_2$ are actuated or deactuated by a selection signal to operate the differential amplifier 214 at a first gain and a second gain. Under "normal" operation, switches $S_1$ and $S_2$ are open or deactuated, meaning that the gain of differential amplifier 214 is generally about $(R_2+R_3)/R_1$. Under "clamping" conditions, the switches S1 and S2 are actuated to scale back to a gain of about $R_2/R_1$.

In operation, system 200 begins under "normal" operation and attenuates the gain of differential amplifier 214 if "clamping" conditions occur. Preferably, the outputs of differential amplifier 214 are received by comparator 204, and the comparator compares the larger of the values from the differential amplifier 214 to the first threshold $V_{TH1}$ (transmitted or supplied) by the switch network 208. Once the greater output from the differential amplifier 214 is larger than the threshold $V_{TH1}$, the output from the comparator 204 resets the counter 206, which then can outputs logic low or "0" as a selection signal. The "0" is inverted by inverter 210 as a selection signal, which actuates switches $S_1$ and $S_2$, and the "0" is transmitted to OR gate 212 and switch network 208, causing the switch network 208 to transmit threshold voltage $V_{TH2}$ to comparator 204.

Once the second gain for the differential amplifier is implemented, the system 200 waits for the "clamping" condition to clear. Preferably, the comparator 204 outputs a signal to the counter 206. When the larger of the outputs of the differential amplifier is smaller than the second threshold $V_{TH2}$, the counter 206, though, does not immediately issue a selection signal to deactuate switches $S_1$ and $S_2$; instead, the output logic (preferably, inverter 210 and OR gate 212) enable to the counter 206 to measure whether a predetermined or "hysteresis" period has lapsed (by waiting for the counter 206 to become full). Preferably, the previous "0" is ORed with a clock signal CLK so as to provide a hysteresis or delay in the transition from the second gain to the first gain. By having this hysteresis, recovery is generally ensured. Additionally, system 200 can be modified to operate with multiple gains (more than two) and can be modified to operate with different polarities.

Now turning to FIG. 3, the differential amplifier 214 can be seen in greater detail. Differential amplifier 214 does not generally operate or amplify based solely on the input signals provided through its inverting and non-inverting terminals, but also generally uses feedback from comparator 204. Preferably, the differential amplifier 214 is comprised of three sections: the first amplifier stage 304, the second amplifier stage 306, and the common mode stage 308.

The differential amplifier is configured as a two stage fully differential structure. The first stage 304 is generally comprised of a current mirror (preferably PMOS FETs $Q_3$ and $Q_4$), differential input pair (preferably NMOS FETs $Q_1$ and $Q_2$), and a bias transistor $Q_8$ (which is preferably an NMOS FET). The second stage 306 is generally comprised of transistors $Q_5$ and $Q_6$ (which are preferably PMOS FETs) and current sourcing transistors $Q_7$ and $Q_9$ (which are preferably NMOS FETs) and provides the output signals $V_{OUT1}$ and $V_{OUT2}$. The common mode stage is generally comprised of transistors $Q_{10}$ through $Q_{14}$, which set the output common mode signal by comparing it with common mode reference voltage $V_{CM}$ and which feeds back the result to control the gate voltage of transistors $Q_3$ and $Q_4$.

Now turning to FIG. 4, the comparator 204 and switch network 208 can be seen in greater detail. In operation, the switch network 208 operates to transmit one of the threshold voltages $V_{TH1}$ and $V_{TH2}$ to comparator 204. The comparator 204 is able to compare the larger of the output signals $V_{OU1}$ and $V_{OUT2}$ from differential amplifier 214 to one of the threshold voltages $V_{TH1}$ and $V_{TH2}$.

The switch network 208 is generally comprised of transistors $Q_{15}$ and $Q_{16}$ that operate as an analog switch. Transistor $Q_{16}$ (which is preferably a PMOS FET) is coupled to comparator 204 at its source and receives threshold voltage $V_{TH2}$ at its drain. Transistor $Q_{15}$ (which is preferably a PMOS FET) is coupled to comparator 204 at its source and receives threshold voltage $V_{TH1}$ at its drain. A selection signal, which is generally the output of counter 206, is employed to select between threshold voltages $V_{TH1}$ and $V_{TH2}$. Preferably, transistor $Q_{16}$ is actuated when the output of counter 206 is logic low or a "0." Additionally, inverter 402 inverts the output of counter 206 so that transistor $Q_{15}$ is actuated when the output of counter 206 is logic high or "1."

The comparator 204 is generally comprised of activation or enable transistors, a differential pair arrangement, a current mirror, and a selective branch. Bias transistor $Q_{19}$ (which is preferably PMOS FETs) is coupled to voltage rail 310 and receive a bias voltage $V_{BIAS1}$. Bias transistors $Q_{18}$ and $Q_{27}$ (which are preferably NMOS FETs) are coupled to voltage rail 312 and receive bias voltage $V_{BIAS2}$. Transistors $Q_{20}$ and $Q_{22}$ (which are preferably PMOS FETs) are coupled to one another in a differential pair arrangement and are coupled to current sourcing transistors $Q_{24}$ and $Q_{25}$ (which are preferably NMOS FETs) that operate as a current mirror. Additionally, transistors $Q_{21}$ and $Q_{26}$ (which are preferably NMOS FETs) generally comprise the selective branch.

In operation, the output of the switch network 208 can then be applied to comparator 204 along with output signals from the outputs $V_{OU1}$ and $V_{OUT2}$ from differential amplifier 214. Preferably, transistor $Q_{17}$ (which is preferably an NMOS FET) is coupled at its gate to the source of transistors $Q_{15}$ and $Q_{16}$ and is coupled between voltage rails 308 and 310; thus, transistor $Q_{17}$ operates as a source follower which transfers the selected threshold voltage $V_{TH1}$ or $V_{TH2}$ from switch network 208 to the gate of transistor $Q_{20}$. Additionally, the selective branch (transistors $Q_{21}$ and $Q_{26}$ that are coupled generally in parallel to one another) selects the greater of the outputs $V_{OUT1}$ and $V_{OUT2}$ and transfers it to the gate of transistor $Q_{22}$. The output $V_{OUT}$ of comparator 204 is then output through the drain of transistor $Q_{29}$ (which is preferably an NMOS FET).

Figure 5:
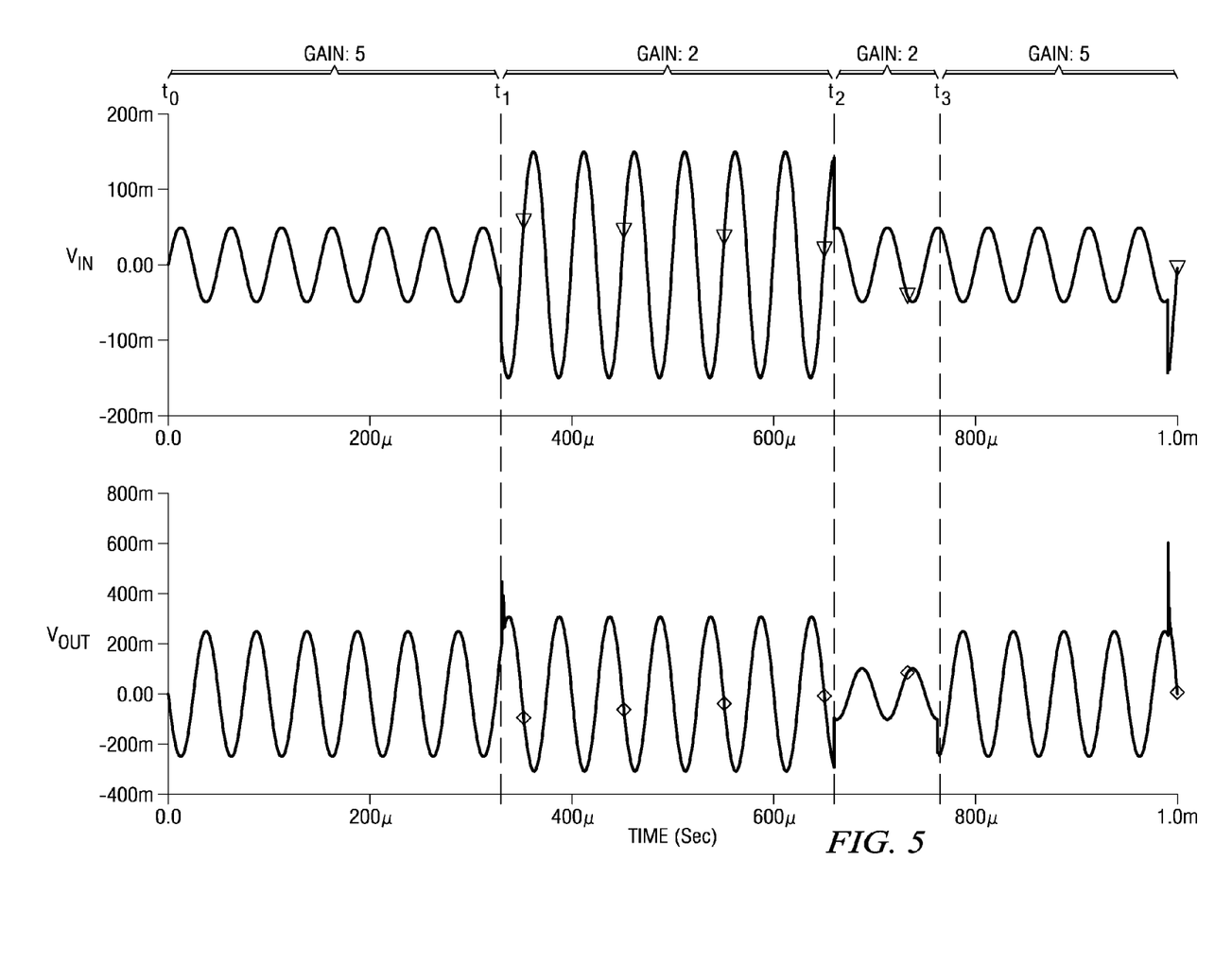
FIG. 5 is a graph depicting the input and output voltages of the system of FIG. 2.

Now turning to FIG. 5, a graph depicting an example of the operation of system 200 is shown. For FIG. 5, it is assumed that the common mode voltage is 0.8V, the selected maximum peak-to-peak output voltage from the differential amplifier 214 is 2228 mV, the selected peak-to-peak output threshold voltage is 1000 mV, and the "normal" gain of differential amplifier 214 is 5. With these assumptions, threshold voltage $V_{TH1}$ is 1.05V (due to fully differential structure, the 1000 mV threshold voltage can be transferred into 250 mV over common mode voltage: 0.8+0.25=1.05V), and threshold voltage $V_{TH2}$ is 0.9V. Additionally, with these assumptions, the second gain or gain under "clamping" conditions is 2. Between times $t_0$ and $t_1$, the differential amplifier 214 is operating under "normal" conditions. At time $t_1$, a "clamping" condition occurs because the peak-to-peak output voltage ($V_{DOUT}$) exceeds 1000 mV, so that system 200 changes the gain from 5 to 2. Between times $t_1$ and $t_2$, the system 200 remains under "clamping" conditions. At time $t_2$, the peak-to-peak input voltage falls to a level such that the output voltage at a gain of 5 would not exceed the threshold of 1000 mV; however, because of the hysteresis included in system 200, the gain remains at 2 for a predetermined period between times $t_2$ and $t_3$ to generally ensure recovery. At time $t_3$, the gain is returned to 5.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   an amplifier having a first gain and a second gain that are selected by a first selection signal, wherein the amplifier receives an input voltage and generates a plurality of output voltages by amplifying the input voltage by one of the first and second gains, and wherein the amplifier includes an impedance network that is adapted to generate a first impedance and a second impedance that correspond to the first and second gains based on the first selection signal;
   a comparator that receives the plurality of output voltages from the amplifier, wherein the comparator compares the greater of the plurality of outputs from the amplifier to one of a first threshold voltage and a second threshold voltage;
   a switch network that is adapted to provide at least one of the first and second threshold voltages to the comparator based on a second selection signal; and
   gain adjustment logic that receives an output from the comparator, that provides the first selection signal to the amplifier, and that provides the second selection signal to the switch network, wherein the gain adjustment logic provides a hysteresis when transitioning from the second gain to the first gain.

2. The apparatus of claim 1, wherein the gain adjustment logic further comprises:
   a counter that receives the output from the comparator and that outputs the second selection signal;
   an inverter that receives the second selection signal and generates the first selection signal from the second selection signal; and
   an OR gate that logically ORs the second selection signal with a first clock signal and that provides a second clock signal to the counter.

3. The apparatus of claim 1, wherein the switch network further comprises:
   an inverter that receives the second selection signal and generates the first selection signal from the second selection signal;
   a first transistor that receives the first selection signal at its gate and that receives the first threshold voltage at its drain; and
   a second transistor that receives the second selection signal at its gate, that receives the second threshold voltage at its drain, and that is coupled to the source of the first transistor at its source.

4. The apparatus of claim 1, wherein the amplifier receives a feedback voltage from the comparator.

5. The apparatus of claim 1, wherein the amplifier further comprises a differential amplifier that is coupled to the impedance network, wherein the differential amplifier has:
   a first amplifier stage that receives a non-inverting input signal and an inverting input signal;
   a second amplifier stage that is coupled to the first amplifier stage and, that provides the plurality of output voltages; and
   a common mode stage that is coupled to the first and second amplifier stages and that receives a common mode reference voltage.

6. The apparatus of claim 5, wherein the impedance network further comprises:
   a first resistor that is coupled to the first amplifier stage of the differential amplifier;
   a second resistor that is coupled to the first resistor;
   a third resistor that is couple between the second resistor and the first amplifier stage of the differential amplifier;
   a first switch that is coupled in parallel to the third resistor, wherein the first switch is actuated and deactuated by the first selection signal;
   a fourth resistor that is coupled to the first amplifier stage of the differential amplifier;
   a fifth resistor that is coupled to the fourth resistor;
   a sixth resistor that is coupled between the fifth resistor and the first amplifier stage of the differential amplifier; and
   a second switch that is coupled in parallel to the sixth resistor, wherein the second switch is actuated and deactuated by the first selection signal.

7. The apparatus of claim 5, wherein the first amplifier stage further comprises:
   a current mirror;
   a pair of differential input FETs, wherein each FET is coupled to the current mirror, and wherein each FET receives one of the non-inverting and the inverting input signals; and
   a bias transistor that is coupled to each of the FETs.

8. The apparatus of claim 1, wherein the comparator further comprises:
   a first FET that is coupled to the switch network at its gate, that is coupled to a first voltage rail at its drain, and that is coupled to a second voltage rail at its source;
   a second FET that is coupled to the first voltage rail at its drain and that receives at least one of the output voltages at its gate;
   a third FET that is coupled to the first voltage rail at its drain and that receives at least one of the output voltages at its gate;
   a fourth FET that is coupled to the first voltage rail at its source;
   a fifth FET that is coupled to the source of the first FET at its gate and that is coupled to the drain of the fourth FET at its source;
   a sixth FET that is coupled to the sources of the second and third FETs at its gate and that is coupled to the drain of the fourth FET at its source.

9. An apparatus comprising:
   a differential amplifier having:
      a first amplifier stage that receives a non-inverting input signal and an inverting input signal;
      a second amplifier stage that is coupled to the first amplifier stage and, that provides the plurality of output voltages; and
      a common mode stage that is coupled to the first and second amplifier stages and that receives a common mode reference voltage;
   an impedance network that is coupled to the differential amplifier and that is adapted to generate a first impedance and a second impedance for the differential amplifier that correspond to a first gain and a second gain for the differential amplifier based on a first selection signal;
   a comparator that is coupled to the first amplifier stage of the differential amplifier so as to receives the first and second output signals from the amplifier section and to provide the inverting and non-inverting feedback signals to the amplifier section, wherein the comparator compares the greater of the plurality of outputs from the amplifier to one of a first threshold voltage and a second threshold voltage;
a switch network that is coupled to the comparator, wherein the switch network is adapted to provide one of the first and the second threshold voltages to the comparator based on a second selection signal;
a counter that receives the output from the comparator and that outputs the second selection signal, wherein the counter provides a hysteresis when transitioning from the second gain to the first gain; and
output logic is coupled to the counter and the impedance network, wherein the output logic receives the second selection signal and generates the first selection signal from the second selection signal, and wherein the output logic provides a second clock signal to the counter.

10. The apparatus of claim 9, wherein the output logic further comprises:
an inverter that receives the second selection signal and generates the first selection signal from the second selection signal; and
an OR gate that logically ORs the second selection signal with a first clock signal and that provides a second clock signal to the counter.

11. The apparatus of claim 9, wherein the impedance network further comprises:
a first resistor that is coupled to the amplifier section of the differential amplifier;
a second resistor that is coupled to the first resistor;
a third resistor that is couple between the second resistor and the first amplifier stage of the differential amplifier;
a first switch that is coupled in parallel to the third resistor, wherein the first switch is actuated and deactuated by the first selection signal;
a fourth resistor that is coupled to the first amplifier stage of the differential amplifier;
a fifth resistor that is coupled to the fourth resistor;
a sixth resistor that is coupled between the fifth resistor and the first amplifier stage of the differential amplifier; and
a second switch that is coupled in parallel to the sixth resistor, wherein the second switch is actuated and deactuated by the first selection signal.

12. The apparatus of claim 9, wherein the switch network further comprises:
a first transistor that receives the first selection signal at its gate and that receives the first threshold voltage at its drain; and
a second transistor that receives the second selection signal at its gate, that receives the second threshold voltage at its drain, and that is coupled to the source of the first transistor at its source.

13. The apparatus of claim 9, wherein the comparator further comprises:
a first FET that is coupled to the switch network at its gate, that is coupled to a first voltage rail at its drain, and that is coupled to a second voltage rail at its source;
a second FET that is coupled to the first voltage rail at its drain and that receives the first output signal at its gate;
a third FET that is coupled to the first voltage rail at its drain and that receives the second output signal at its gate;
a fourth FET that is coupled to the first voltage rail at its source;
a fifth FET that is coupled to the source of the first FET at its gate and that is coupled to the drain of the fourth FET at its source;
a sixth FET that is coupled to the sources of the second and third FETs at its gate and that is coupled to the drain of the fourth FET at its source.

14. The apparatus of claim 9, wherein the first amplifier stage further comprises:
a current mirror;
a pair of differential input FETs, wherein each FET is coupled to the current mirror, and wherein each FET receives one of the non-inverting and the inverting input signals; and
a bias transistor that is coupled to each of the FETs.

15. A method for providing automatic gain control for a differential amplifier, the method comprising the steps of:
setting an impedance network to have a first impedance that corresponds to a first gain for the differential amplifier;
amplifying an input signal by the first gain;
determining whether the input signal that is amplified by the first gain is greater than a first threshold voltage;
setting the impedance network to have a second impedance that corresponds to a second gain for the differential amplifier if the input signal that is amplified by the first gain is greater than the first threshold voltage;
amplifying an input signal by the second gain;
determining whether the input signal that is amplified by the second gain is greater than a second threshold voltage;
determining whether a predetermined period has lapsed if the input signal that is amplified by the second gain is greater than the second threshold voltage; and
resetting the impedance network to have the first impedance that corresponds to a first gain for the differential amplifier.

16. The method of claim 15, wherein the step of determining whether the input signal that is amplified by the first gain is greater than a first threshold voltage further comprises:
receiving a first output signal and a second output signal from the differential amplifier by a comparator;
providing a first feedback signal and a second feedback signal to the differential amplifier; and
comparing the greater of the first and second output signals to the first threshold voltage.

17. The method of claim 15, wherein the method further comprises the step of setting a switch network to transmit the second threshold voltage to a comparator if the input signal that is amplified by the first gain is greater than a first threshold voltage.

18. The method of claim 15, wherein the method further comprises the step of setting a switch network to transmit the first threshold voltage to a comparator if the predetermined period has lapsed.

19. The method of claim 15, wherein the method further comprises the steps of:
clearing a counter if the input signal that is amplified by the first gain is greater than the first threshold voltage; and
starting the counter if the input signal that is amplified by the first gain is greater than the first threshold voltage.

20. The method of claim 19, wherein the step of determining whether the predetermined period has lapsed if the input signal that is amplified by the second gain is greater than the second threshold voltage further comprises determining if the counter is full.

* * * * *